United States Patent
Frederick, Jr. et al.

(10) Patent No.: US 8,824,215 B2
(45) Date of Patent: Sep. 2, 2014

(54) DATA STORAGE CIRCUIT THAT RETAINS STATE DURING PRECHARGE

(75) Inventors: Marlin Wayne Frederick, Jr., Austin, TX (US); Akhtar Waseem Alam, Varanasi U.P. (IN); Sumana Pal, Anekal Taluk (IN)

(73) Assignee: ARM Limited, Cambridge (GB)

( * ) Notice: Subject to any disclaimer, the term of this patent is extended or adjusted under 35 U.S.C. 154(b) by 185 days.

(21) Appl. No.: 13/363,623

(22) Filed: Feb. 1, 2012

(65) Prior Publication Data

US 2013/0064019 A1 Mar. 14, 2013

(30) Foreign Application Priority Data

Sep. 12, 2011 (IN) .............................. 2639/DEL/2011

(51) Int. Cl.
*G11C 7/10* (2006.01)

(52) U.S. Cl.
USPC ............. 365/189.05; 365/189.15; 365/189.17

(58) Field of Classification Search
CPC .......... G11C 7/22; G11C 7/06; G11C 7/1051; G11C 7/1078
USPC ................ 365/189.011, 189.15 X, 189.17 X, 365/189.05 O
See application file for complete search history.

(56) References Cited

U.S. PATENT DOCUMENTS

| 6,353,572 B2 * | 3/2002 | Yagishita ................. 365/230.08 |
| 6,717,448 B2 * | 4/2004 | Heo et al. ....................... 327/202 |
| 7,471,580 B2 * | 12/2008 | Henzler et al. ................ 365/207 |

OTHER PUBLICATIONS

C. De Caro et al, "A High-Speed Sense-Amplifier based Flip-flop" 2005, 4 pages.
T. Darwish et al, "Reducing the Switching Activity of Modified SAFF flip-Flop for Low Power Applications" IEEE, 2000, pp. 96-99.
S. Cho et al, "CMOS Sense-Amplifier Type Flip-Flop Having Improved Setup/Hold Margin" IEICE Trans. Electron. vol. E86-C, No. 12, Dec. 2003, pp. 2508-2510.

* cited by examiner

*Primary Examiner* — Vanthu Nguyen
(74) *Attorney, Agent, or Firm* — Nixon & Vanderhye P.C.

(57) ABSTRACT

A data storage circuit for receiving and holding a data value includes an input stage configured to receive a data value in response to the precharge phase changing to an evaluation phase and to hold the data value during the evaluation phase. An output stage has an output latching element for holding the value, two switching devices for updating the output latching element and an output. The switching devices each being controlled by respective signals from dual data lines, wherein, in response to the data value held in the input stage being a logical one, the first switching device updates the output latching element with a value indicative of the logical one and in response to the data value held in the input stage being a logical zero, the second switching device updates the output latching element with a value indicative of the logical zero.

18 Claims, 8 Drawing Sheets

DATA STORAGE CIRCUIT THAT RETAINS STATE DURING PRECHARGE

BACKGROUND OF THE INVENTION

This application claims priority to Indian Application No. 2639/DEL/2011 filed 12 Sep. 2011, the entire contents of which are incorporated herein by reference.

1. Field of the Invention

This invention relates to the field of data processing systems. More particularly, this invention relates to circuits and methods for storing data in operational and sleep modes.

2. Description of the Prior Art

Conventional sense amplifier latches that receive and output data in response to a clock signal are known. Conventionally these storage circuits receive a data signal and an inverse data signal and store and output these signals on two data lines. Such data storage latches have a precharge cycle in a first half of the clock cycle in which both output lines are precharged, then on the edge of the clock signal the data signal is captured and it is then held for the second half of the clock cycle. A problem with such a circuit is that during the next precharge phase the data that was previously held is lost. Thus, in order for such a latch to function in a useful manner it has conventionally been used as a master latch in a master slave flip flop, the data being transferred to the slave latch before it is lost. It can then be output from the slave latch and the master latch can be precharged again prior to receiving the next data value input.

In some systems sense amplifier latches can be used as the master with a set reset latch acting as the slave latch.

A disadvantage of such an arrangement is that sense amplifier latches are dual rail systems and as such tend to have high power consumption due to the discharge of one of the rails. Furthermore, they generally have significant topological restraints. However, they have the advantage of robust performance with high data slew due to the dual rail data input.

Furthermore, when they are powered down and the clock signal turned off they generally lose the data that they store. Providing them with a data retention capability such that they can retain data in low power mode using perhaps an associated balloon latch has a considerable circuit area impact. For this reason such flip flops provided with such a retention capability are not suitable for use in a standard cell library.

It would be advantageous to produce a robust latching device with differential data inputs but reduced topological restraints. It would also be desirable in some embodiments to be able to provide a flip flop that has a low power retention capability and a size and architecture such that it can be configured as a standard cell in a standard cell library.

SUMMARY OF THE INVENTION

A first aspect of the present invention provides a data storage circuit for receiving and holding a data value said data storage circuit comprising: an input stage configured to be precharged during a precharge phase, to receive a data value in response to said precharge phase changing to an evaluation phase and to hold said data value during said evaluation phase, said input stage comprises an input latching element for holding said data value and dual data lines for outputting said data value and an inverse version of said data value to said output stage, said input latching element being configured to output a logical one on both of said dual data lines during said precharge phase and to output said data value during said evaluation phase by discharging one of said dual data lines to a logical zero; an output stage for holding a value dependent on said data value received from said dual data lines; wherein said output stage comprises an output latching element for holding said value, two switching devices for updating said output latching element and an output, said two switching devices each being controlled by respective signals from said dual data lines, such that: in response to said data value held in said input stage being a logical one, said first switching device updates said output latching element with a value indicative of said logical one; in response to said data value held in said input stage being a logical zero, said second switching device updates said output latching element with a value indicative of said logical zero; and in response to said dual data lines both outputting a logical one, said two switching devices do not supply a logical value to said output latching element such that said output latching element continues to hold a previously held value.

The present invention recognises that the data values output by a sense amplifier type latch with dual data output lines and a precharge phase could be used to control an output stage such that a latching element could receive a data value from the input stage during an evaluation stage but could be isolated and hold a previously held data value during the precharge phase where the data value held in the input latch will be lost. In this way the changes in value on the dual lines could be used not only as data values for input to the output stage but also as control signals during the precharge phase to isolate the output latch and enable it to maintain a stored value. Thus, the timing of the output stage between precharge and evaluation phase is controlled by the change in value of data signals output by the input stage without the need for additional control or timing signals. This has an area and power saving associated with it.

In some embodiments said output latching element comprises an inverter and a tristate inverter arranged to form a feedback loop, said tristate inverter being controlled by a signal received from one of said dual data lines and an inverted signal received from an other of said dual data lines, such that during said precharge stage when said dual data lines output logical ones said instate inverter is driving and said output latching element holds a previously held data value, and in response to one of said dual data lines falling to a logical zero indicating a data value, a portion of said tristate converter is turned off and said output latching element stores said value indicative of said data value.

The signals on the dual data lines can also be used in the control of the output latching element. When the dual data lines are charged to a logical one in the precharge phase they control the tristate inverter to drive and thus, enable the output latching element to hold a data value. When one of the dual data lines discharges in the evaluation phase and a data value is output, a portion of the tristate inverter is switched off. The system is designed so that the portion that is switched off is the portion that would resist the storing of the complementary value to that which is currently stored, so the value received can be stored and held. By controlling the tristate inverter in this way data values are held during precharge mode, and the switching of the feedback loop is facilitated when a data value is received.

In some embodiments said input stage comprises a timing signal input for receiving a timing signal, said input stage being responsive to said timing signal having a first logical value to be in said precharge phase and to said timing signal switching to a second logical value to receive said data value and to enter said evaluation phase.

Although the precharge and evaluation phases may be controlled in different ways, in some embodiments they are controlled by a timing signal, a value of said timing signal determining the phase the input stage is in.

In some embodiments said timing signal comprises a clock signal.

The timing signal may be a traditional clock signal in which case the data storage circuit acts as a clocked data storage circuit, latching data values in response to an edge of a first phase of a clock signal, and outputting them on a second phase of the clock signal. In this way a sense amplifier type latch coupled with dual data lines and an output latch controlled by the dual data lines acts in a similar way to an edge controlled flip flop, with the differential part of the sense amplifier providing the edge triggered type functionality.

It will be understood that data may be latched in response to the rising edge of the clock signal and output when the clock signal is low, or it may be latched on the falling edge and output when the clock signal is high.

In some embodiments, said data value output from said input stage is routed to control one of said two switching devices and said inverted data value output from said input stage is routed via an inverter to control another of said two switching devices, said one of said two switching devices comprising a PMOS transistor and said other of said two switching devices comprising a NMOS transistor.

Using PMOS and NMOS devices as the first and second switching devices is a convenient way of providing the logical one and zero required by the data value, however, it does require the NMOS device to have its control signal from the dual data lines inverted both to provide the opposite value provided by the PMOS and to ensure the NMOS device is switched off during precharge mode providing the required isolation of the output latching element. An inverter in the data path slows the data path, however, an NMOS device is typically faster than a PMOS device so having the inverter in the NMOS path is less detrimental to timing than it would be if it were in the PMOS path.

In some embodiments, said second switching device comprises said PMOS transistor and said output stage comprises an inverter, such that in response to said data value held in said input stage being a logical zero, said second switching device is turned on and updates said output latching element to a logical one and a logical zero is output at said output via said inverter; and said first switching device comprises said NMOS transistor, in response to said data value held in said input stage being a logical one, said first switching device is turned on and updates said output latching element such that logical zero is stored and a logical one is output at said output via said inverter.

In the arrangement above the output latch stores the complementary version of the data value stored in the input latch, thus to provide the same data value at the output an inverter can be used at the output. The system could be arranged differently in which case an inverter would not be required.

In some embodiments said input stage further comprises: at least one precharge control switching device responsive to said timing signal indicating said precharge phase to charge said dual data lines to a logical one; data value inputs for receiving said data value and said inverse data value; a data input control switching device responsive to said timing signal indicating said evaluation phase to update said input latching element with said data value received at said data value inputs.

The circuit may in some embodiments be responsive to a timing signal that controls when the system is in the precharge phase and when in the evaluation phase. In this way a data value can be latched through the circuit in response to the timing signal.

In some embodiments, said input stage further comprises: diagnostic data inputs for receiving a diagnostic data value and an inverse diagnostic data value; data value inputs for receiving said data value and said inverse data value; switching circuitry responsive to a value of a diagnostic mode enable signal and to said timing signal indicating said evaluation phase to update said input latching element either with said data value received at said data value inputs or with a diagnostic data value received at said diagnostic data inputs.

The circuit can be amended to selectively latch either data or diagnostic data, the diagnostic data being received at a different input to the general data. When diagnosing a system it is helpful to be able to be able to access current data values at a point being investigated, thus the ability to latch and hold such data using a circuit that is also used for storing data during processing is a convenient and circuit efficient way of providing this functionality. The provision of a diagnostic data input allows with only a few additional circuit elements diagnostic data to be input and held by the latch as required.

In some embodiments, said data storage circuit is arranged such that in response to a sleep signal indicating entry to a low power mode: a voltage difference across at least a portion of said circuit is reduced such that said portion of said circuit is powered down; a voltage difference across said output stage is maintained; wherein said data storage device further comprises at least one sleep mode switching device responsive to said sleep signal to charge said dual data lines to a logical one, such that during said sleep mode, said two switching devices do not supply a logical value to said output latching element such that said output latching element continues to hold and output a previously held data value.

The configuration of the data storage circuit is such that it retains state when the dual data lines from the input stage to the output stage are precharged. Recognition of this, means that simply by providing switching devices that can supply a logical one to the dual data lines in response to a sleep mode signal the output stage will retain its previously held data value.

In some embodiments said data storage circuit further comprises at least one power switching device for isolating said input stage from a power supply such that said input stage is powered down in response to said sleep signal.

Once the data value is latched into the output stage it will be held there if the dual data lines are supplied with a logical one and the input stage can then be powered down. Thus, the configuration of this storage device makes it eminently suitable for use both an operational latching element in functional mode but also as a retention element in a low power sleep mode.

In some embodiments, said data storage circuit further comprises a further two switching devices arranged between said sleep mode switching device and respective ones of said dual data lines, said further two switching devices receiving said data value and an inverse version of said data value as control signals, said further two switching devices being configured such that in response to said sleep signal indicating entry to low power mode and said control signal being a logical zero a logical one is output on said corresponding dual data line and in response to said control signal being a logical one a logical zero is output on said corresponding dual data line.

In some embodiments an additional two switching devices can be used to insert the data value and inverted data value directly into the output stage when a sleep signal indicates entry to a low power mode. In this way data can be input directly into this stage without the need to power or clock the input stage. Furthermore, as the output latch is arranged to retain state when the dual data lines both hold a logical one if the data value input is no longer driven and falls to zero it will be held in the output stage.

In some embodiments said sleep mode switching device comprises two pmos transistors for coupling a high voltage rail to respective ones of said dual data lines in response to a logical zero as a control signal via two further pmos transistors, said two further pmos transistors receiving said data value and an inverse version of said data value as control signals.

One way of implementing the storage device as a clock independent output latch is to use pmos transistors as the switching devices. These will switch on with zeros at their input and thus, where the data value falls to zero they will output the power supply voltage to the dual data lines and the output stage will hold the previously held data value.

A second aspect of the present invention provides a method of receiving and holding a data value within a data storage circuit comprising an input stage and an output stage comprising the steps of: during a precharge phase: precharging said input stage such that dual data lines of said input stage are each charged to a logical one; controlling first and second switching devices in response to said dual data lines both being charged to a logical one to isolate an output latching element within said output stage from an input logical value such that said output latching element continues to hold a previously held value; switching to an evaluation phase and receiving a data value at said input stage; during said evaluation phase: holding said data value in an input latching element within said input stage and outputting said data value and said inverse data value on said dual data lines by discharging one of said dual data lines to a logical zero; controlling a first and second switching device with said data value output on said dual data lines such that either said first switching element updates an output latching element to a predetermined logical value in response to said data value being a logical one, or said second switching device updates said output latching element to hold a different predetermined logical value in response to said data value being a logical zero.

A third aspect of the present invention provides a standard cell representing a functional component to be provided within a placement area of a predetermined size and having predetermined boundary conditions on an integrated circuit, said functional component being a data storage circuit according to a first aspect of the present invention.

A fourth aspect of the present invention provides data storage means for receiving and holding a data value said data storage circuit comprising: an input means for being precharged in a precharged phase and for receiving a data value in response to said precharge phase changing to an evaluation phase and for holding said data value during said evaluation phase, said clocked input means comprising an input latching means for holding said data value and dual data lines for outputting said data value and an inverse version of said data value to an output means, said input latching means being configured to output a logical one on both of said dual data lines during said precharge phase and to output said data value during said evaluation phase by discharging one of said dual data lines to a logical zero; said output means for holding a value dependent on said data value received from said dual data lines; wherein said output means comprises an output latching means for holding said value, two switching means for updating said output latching element and an output, said two switching means each being controlled by respective signals from said dual data lines, such that: in response to said data value held in said input stage being a logical one, said first switching means updates said output latching means with a value indicative of said logical one; in response to said data value held in said input stage being a logical zero, said second switching means updates said output latching means with a value indicative of said logical zero; and in response to said dual data lines both outputting a logical one, said two switching means do not supply a logical value to said output latching means such that said output latching means continues to hold a previously held value.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
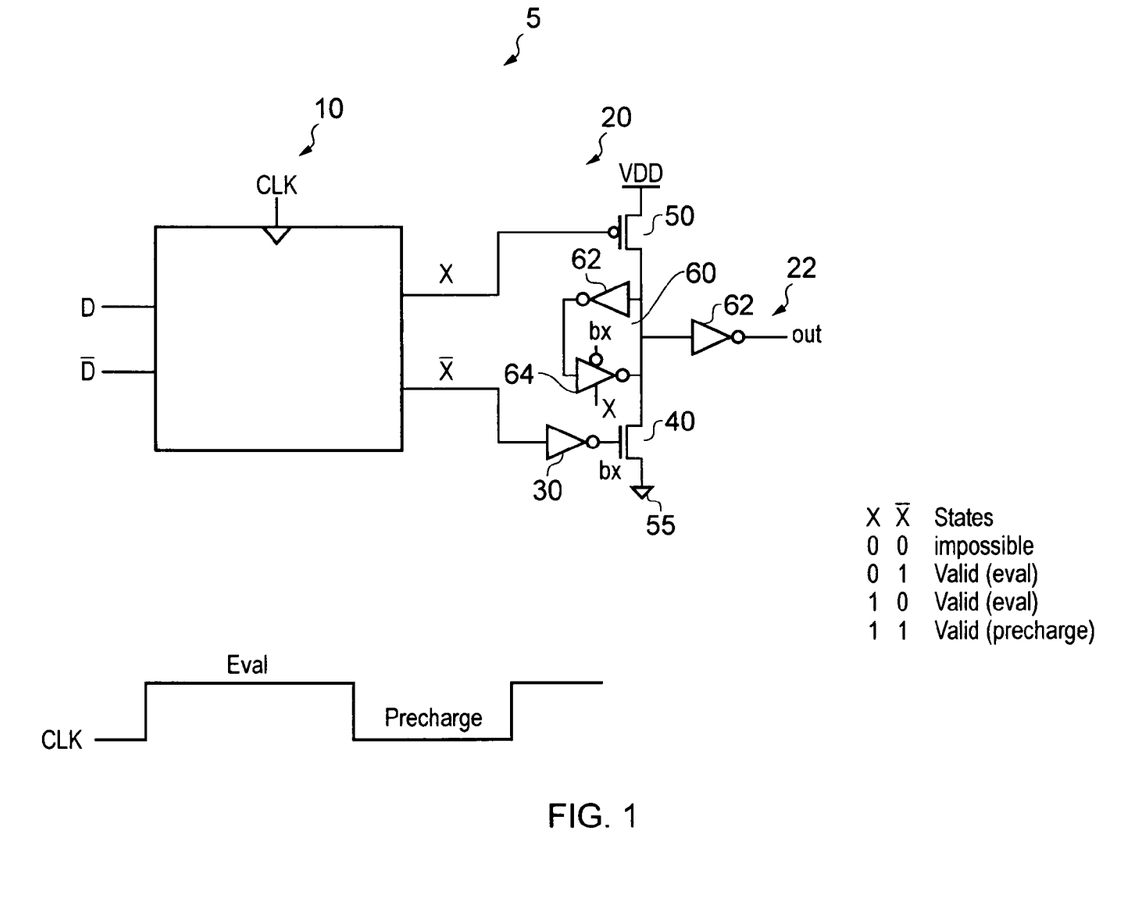
FIG. 1 shows a flip flop according to an embodiment of the present invention.

FIG. 1 shows a flip flop 5 according to an embodiment of the present invention. The flip flop 5 comprises two latching elements 10, 20. A first latching element 10 which has dual data inputs D and $\overline{D}$ and a second output latching element 20 which receives the data value held by latch 10 and holds the complementary or inverse value of the data value output by the input latching element and outputs it via an inverter at output 22. The first latch is clocked and receives a data value at the end of a precharge clock cycle, while the second latch is not clocked, but receives data in response to changes in values on the output lines X and $\overline{X}$ of input latching element 10, this is described in detail below.

The first latching element 10 is not shown in detail but is a conventional sense amplifier type latch. This is configured to work in two phases. There is a precharge phase where the data line D and the complimentary data inputs $\overline{D}$ are precharged and then when the precharge phase ends the data value is connected to these data inputs and one of them will discharge and the difference in voltage between the two lines will be sensed and this sensed data value will update a value stored in a feedback loop within the latch 10 located between the two data inputs. It should be noted that if the value currently stored is the same as the data value that is sensed at the inputs then it will update by simply retaining this value, whereas if the value sensed is the complementary logical value then it will switch to retain the new data value.

This value is then held during the next evaluation phase of the clock cycle.

During the precharge phase the dual data lines X and $\overline{X}$ are also both precharged to one. The values from these data lines control PMOS transistor 50 and NMOS transistor 40. In this regard X controls PMOS transistor 50 and $\overline{X}$ inverted by inverter 30, that is signal bX, controls NMOS transistor 40. Thus, in precharge mode when X and $\overline{X}$ are both charged to a logical one, both of transistors 40 and 50 are switched off. This isolates the feedback loop 60 from the supply voltages VDD and VSS. Furthermore, tristate inverter 64 which is controlled by X and bX is, when these two signals have the same value, in a driving state and thus, feedback loop 60 is driven, is isolated from an input value and therefore retains its previously held state. Thus, this arrangement allows the output latching element 20 to hold state during the precharge phase when state is lost from the input latching element 10.

At the end of the precharge phase, the clock changes state and in response to this the data value input from the data lines D and $\overline{D}$ is received at the input latching element 10, held and output on the dual data lines X and $\overline{X}$. In response to this one of these dual data lines will discharge to 0 and this will result in one of the two transistors 50 or 40 turning on and a logical value being input to feedback loop 60.

Feedback loop 60 comprises an inverter 62 and a tristate inverter 64. Tristate inverter 64 receives control signals from X and bX, bX being an inverted value of $\overline{X}$. As noted previously, when both X and $\overline{X}$ have the same value then X and bX will have different values and the tristate inverter will be driven. When X and bX have the same value then one half of the tristate inverter will turn off.

If the data value stored in input latching element 10 is a logical 1 then $\overline{X}$ will fall to 0 and bX will rise to 1 via inverter 30. bX being 1 will turn NMOS transistor 40 on while X being 1 will turn PMOS transistor 50 off. Thus, a 0 will be applied to feedback loop 60 which will be updated to hold this value. This value will be output from feedback loop 60 via inverter 62 and thus, a value of 1 will be output. As X and bX now have opposite values a portion of tristate inverter 64 will be turned off. However, it is not the portion that stores the 0 and thus, the feedback loop 60 will continue to hold the 0.

If, by contrast, the data value stored in input latching element 10 was a logical 0 then $\overline{X}$ will rise to 1 and bX will fall to 0 via inverter 30. bX being 0 will turn NMOS transistor 40 off while X being 0 will turn PMOS transistor 50 on. Thus, a 1 will be applied to feedback loop 60 which will be updated to hold this value. This value will be output from feedback loop 60 via inverter 62 and thus, a value of 0 will be output. As X and bX now have opposite values a portion of tristate inverter 64 will be turned off. However, it is not the portion that stores the 1 and thus, the feedback loop 60 will continue to hold the 1.

In this way, output latch 60 although not clocked will update at the end of the precharge cycle in response to a data value being output on dual data lines X and $\overline{X}$. It will then hold that data value during the next precharge cycle.

In this way, this circuit acts as a flip flop with the data value being input via data lines D and $\overline{D}$ being latched through these stages and output via output 22.

As can be seen from this diagram the output latch has various states, the state corresponding to X and $\overline{X}$ both being 0 is an impossible state while the other states are valid states. The state with them both being a 1 is the precharge state and during this state the previously held value within feedback loop 60 continues to be held. When a data value is output on the X and $\overline{X}$ lines the feedback loop 60 is updated with this value.

Figure 2:
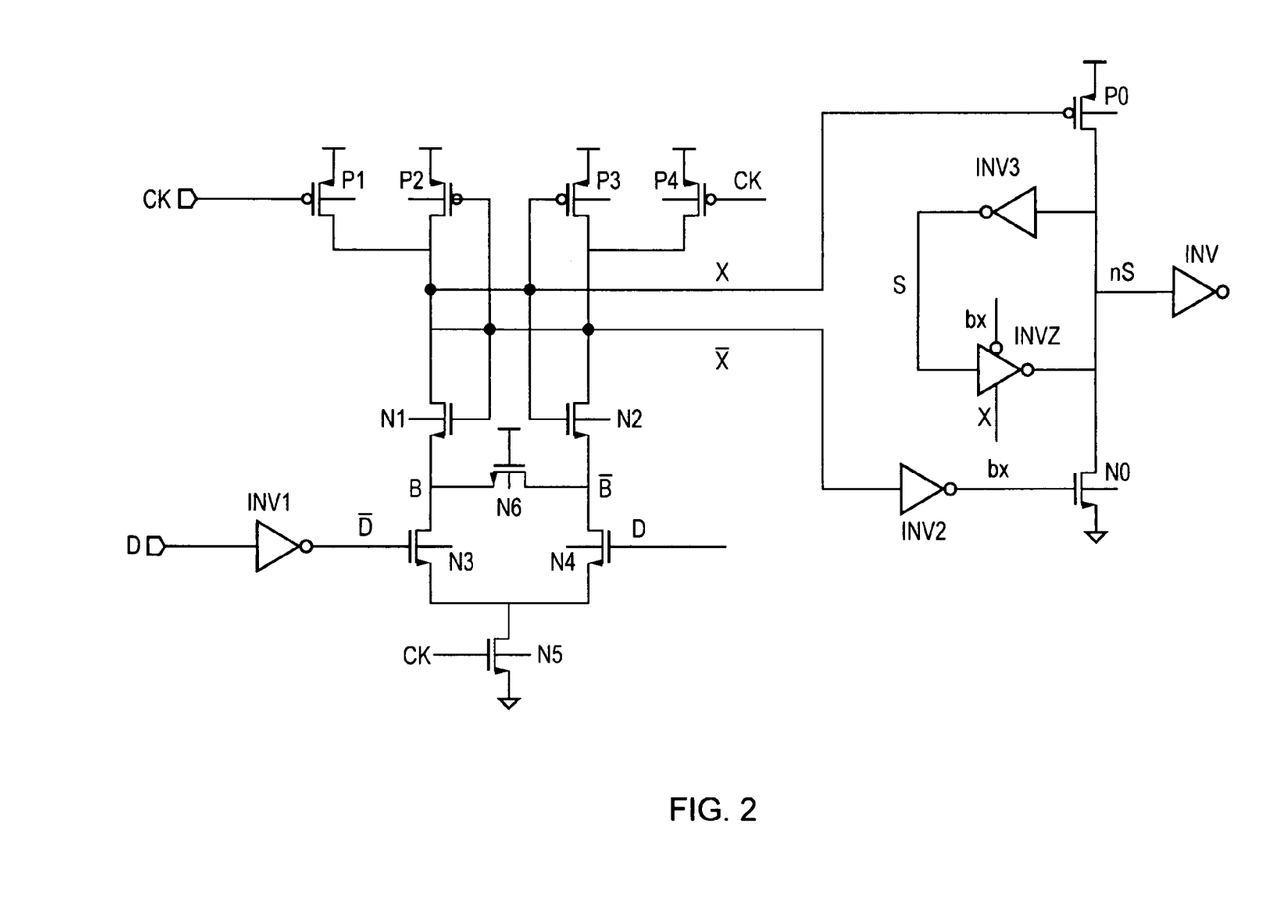
FIGS. 2 and 3 show in transistor form the topology of data storage cells according to an embodiment of the present invention.
Figure 3:
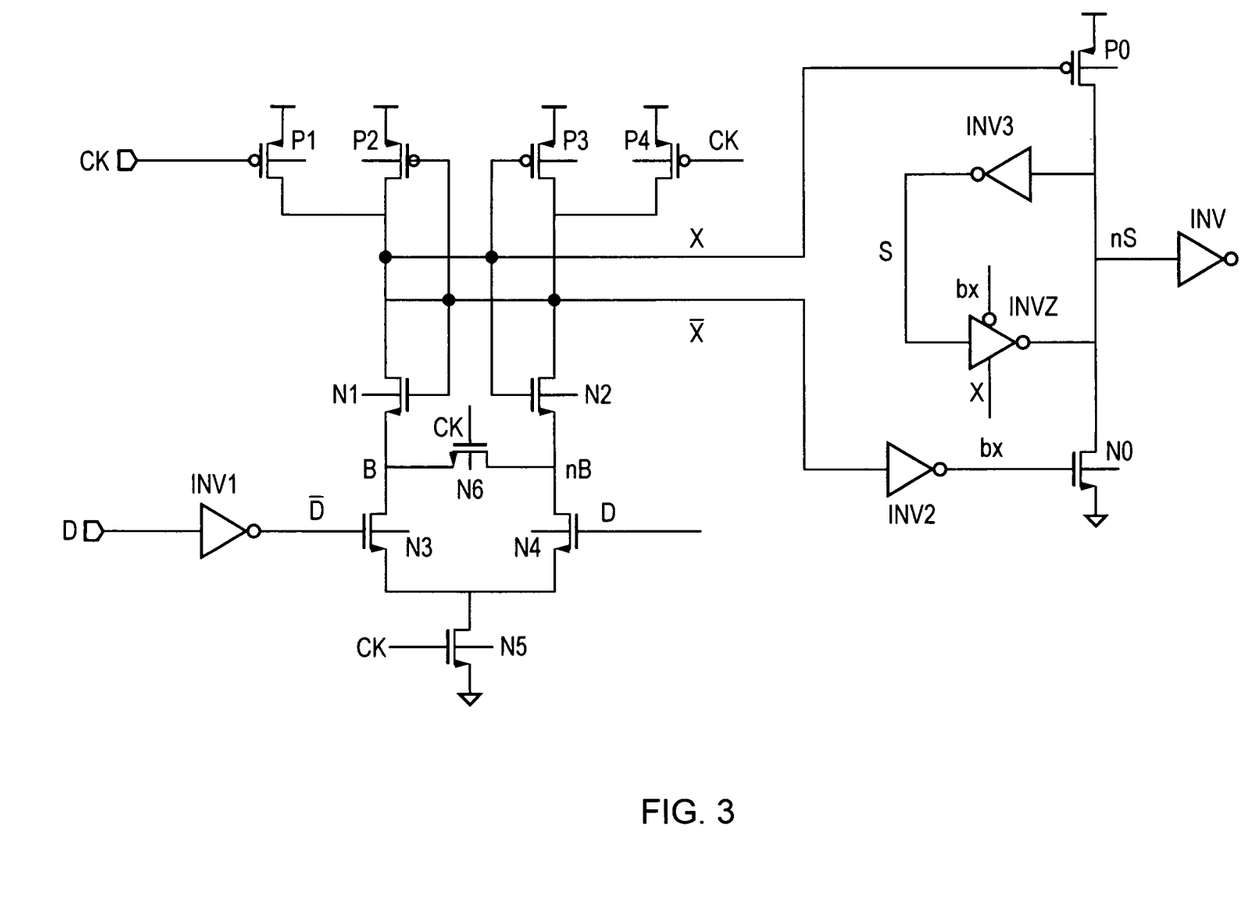

FIGS. 2 and 3 show in transistor form the topology of data storage cells according to an embodiment of the present invention with similar functionality to the flip flop shown in FIG. 1. In these circuits during the precharge phase (in this embodiment CK=0), pull-down transistor N5 will be switched off; the node X and $\overline{X}$ will be charged to VDD through PMOS transistors P2 and P4. The node bx which is $\overline{X}$ inverted by inverter inv2 will fall to a logical zero. The state X=1 and bX=0 (Pre-charge phase) will cause both transistors P0/N0 to be in their cut-off region and data currently held in the output latch will be preserved.

During the evaluation phase (in this embodiment CK=1): if D=1, the node $\overline{X}$ and nB will be discharged to zero (ground). The nodes X and bX will rise to a logical one. The transistor: P0 will move into cutoff mode (switch off) and transistor: N0 will move into active region (switch on). The node nS will be driven by pull-down transistor N0 and hence data 1 will be output.

During the evaluation phase: if D=0, the node X and B will be discharged to zero (ground). The nodes $\overline{X}$ and bX will be at logical zero. The transistor N0 will move into cutoff mode (switch off) and transistor P0 will move into active region (switch on). The node nS will be driven by pull-up transistor P0 and hence data 0 will be output.

Figure 4:
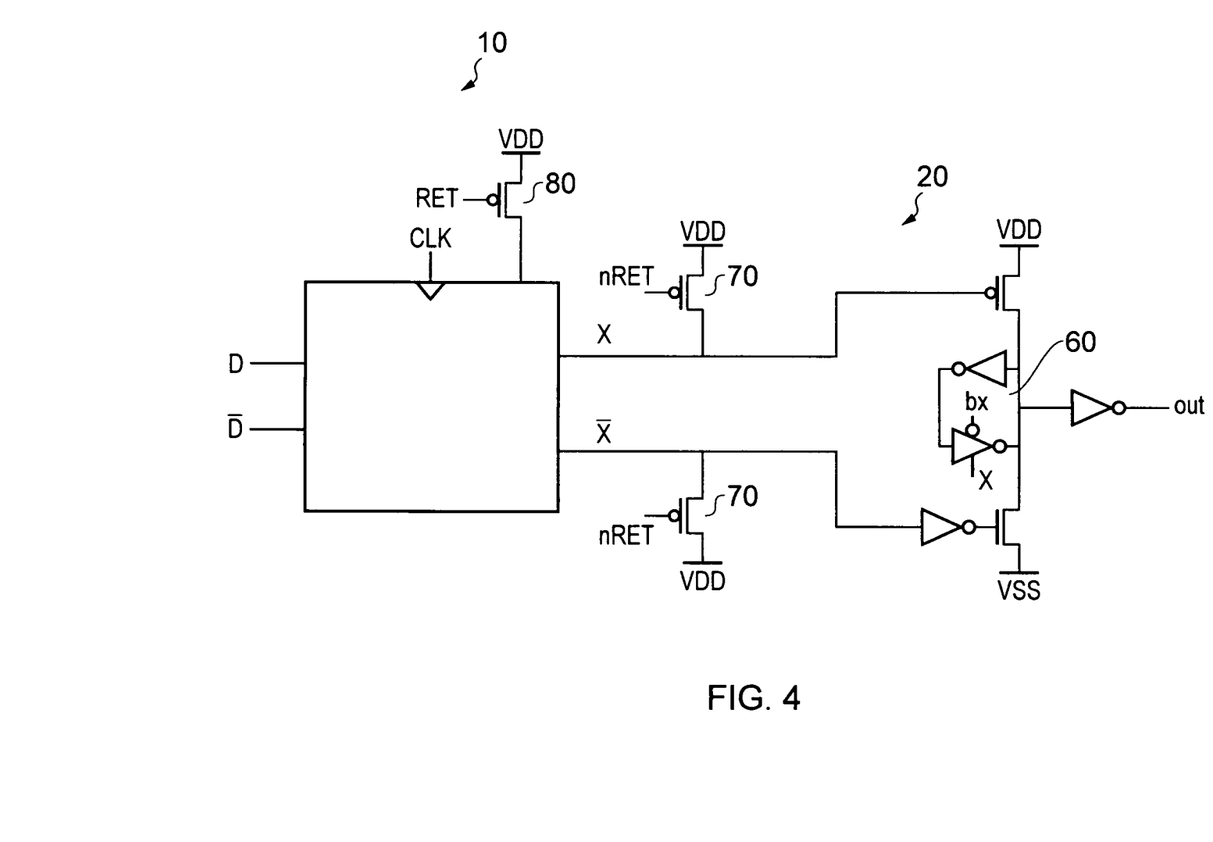
FIG. 4 shows a flip flop with a retention mode of operation according to an embodiment of the present invention.

FIG. 4 shows a retention version of the circuit of FIG. 1. As noted previously the configuration of the flip flop of FIG. 1 is such that when during the precharge phase a logical 1 is output on dual data lines X and $\overline{X}$ the output latch 60 continues to hold a previously held value. This property of the output latch can be used to provide this circuit with a data retention functionality in low power mode without the need for many additional circuit elements.

Thus, in this example, switching elements 70 are applied to the dual data lines X and $\overline{X}$ between the latching elements such that they can be connected to the supply voltage and held at a logical one and in this state the output latch 60 will hold its current value. Thus, in this example the retention functionality is introduced by the addition of two transistors 70 which are controlled by a retention signal indicating entry to low power mode and supply a logical one to the dual data lines X and $\overline{X}$ in response to this signal. Thus, provided power is still applied to the output stage 20, this stage will continue to hold the data value that it previously held. The input stage 10 can be turned off at this point using power transistor 80 and the data will be retained in the output stage 20, while power can be saved by powering down the input stage 10. It should be noted that although not shown when the input stage is powered down the clock signal to this latching element is also powered down.

In this way the flip flop such as is shown in FIG. 1 can be converted to a retention flip flop simply by the addition of a control signal and three additional transistors 70, 80. This makes a very area efficient retention flip flop and one that could be provided as a standard cell.

Figure 5:
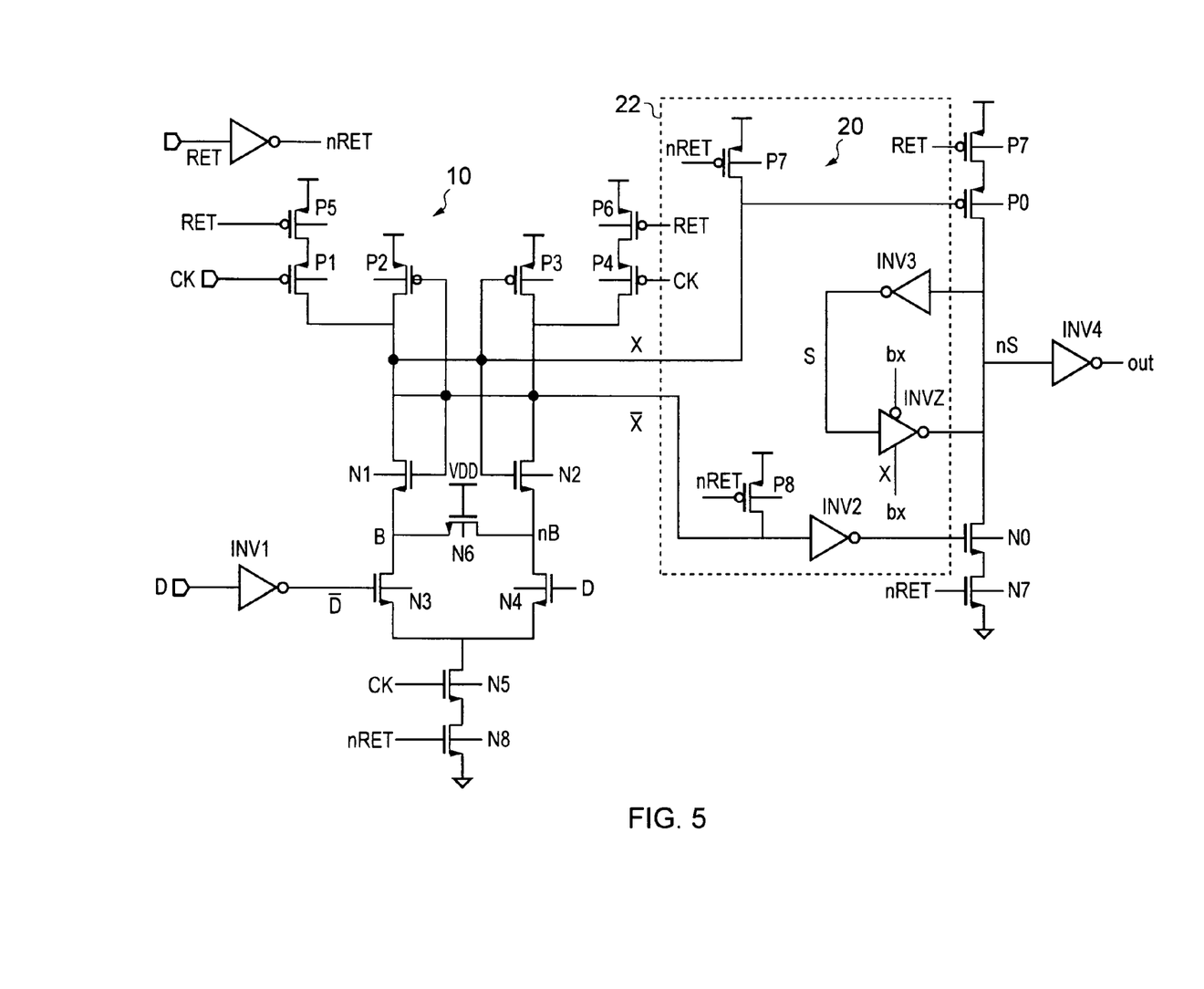
FIG. 5 shows a flip flop with a retention mode of operation according to another embodiment of the present invention.

FIG. 5 shows the topology of HPSARFF High Performance Low Power Sense Amplifier Retention Flop Architecture of an embodiment of the present invention. This is an edge triggered retention flop which has "differential" topology at the input stage.

This flip flop functions as follows. In normal operating mode when RET=0, and CK=0: X. $\overline{X}$ will be in the pre-charge state. During this pre-charge state, X and bX will be at a logical one and logical zero respectively; therefore both N0 and P0 transistors will be in cut-off mode; and the data currently stored in output latch 20 will be preserved.

At the rising edge of the clock (CK), with RET=0, and D=1: node $\overline{X}$ will start discharging through transistors N2/N4. As node $\overline{X}$ discharges to zero, transistor P2 will switch on while node X will remain at logical one and therefore it will force node X̄ to a logical zero; as result of this X/bX will rise to logical one and PMOS P0 will switch off while NMOS N0 will switch on. As N0 starts conducting, node "S" will discharge to zero and the data will be written to the output latch and therefore a logical one will be output at output port "OUT".

At the rising Edge of clock (CK), with RET=0, and with D=0: Node X will start discharging through transistors N1/N3. As node X discharges to zero, transistor P3 will get into the conducting mode, and node X̄ will be maintained at a logical one; and hence bX will remain at logical zero; therefore NMOS N0 will be in cut-off mode. As node "X" moves to the logical zero state, PMOS P0 will switch on. Therefore node "S" will charge to a logical one and this data will be stored in latch 20 and a logical zero will be output at "OUT".

In low power mode with RET=1, the parts of the devices within dotted line 22 will be driven by VDDG and they will remain active. Node "X" will be charged to VDDG through power-on device P7 and node bX will be discharge to zero through power-on device N7 and inverter INV2. Both transistor P0 and N0 will move into cutoff mode and the data at the output stage will be intact. Once the circuit is powered up, the stored data will be output at "OUT".

Figure 6:
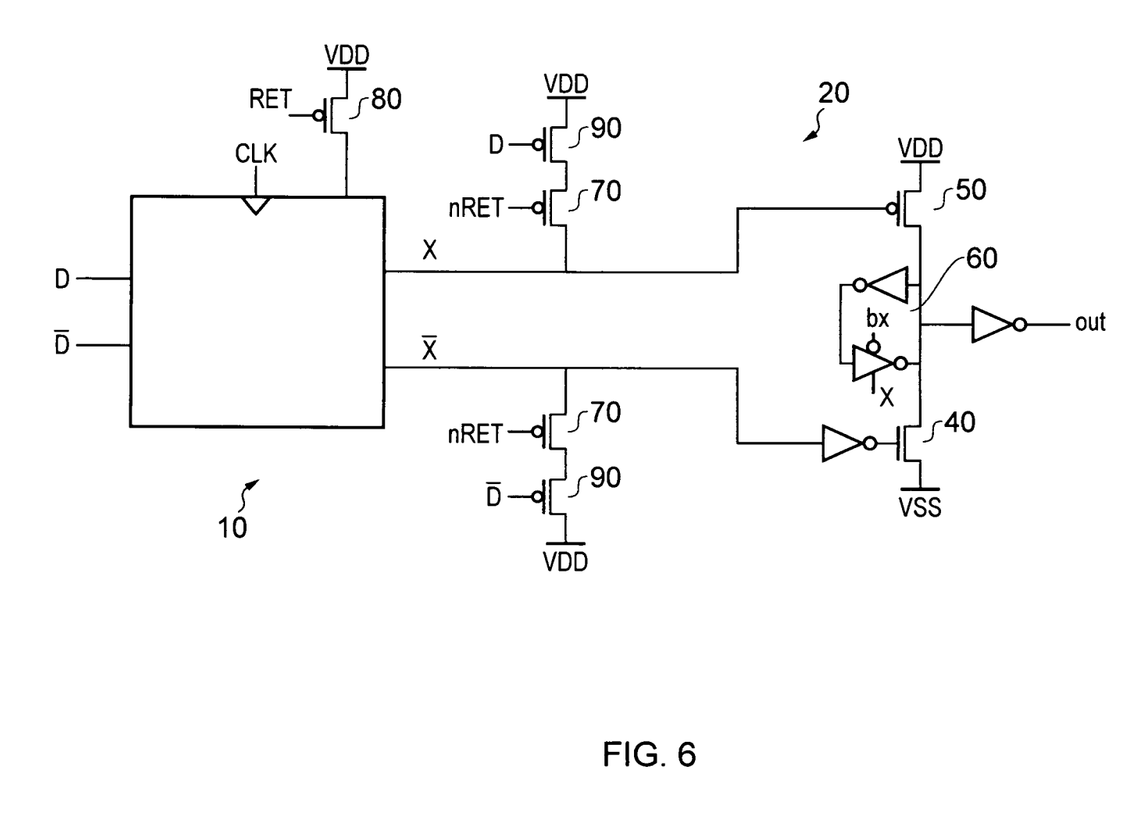
FIG. 6 shows a flip flop similar to that of FIG. 4 with an additional input for inputting data to the output stage.

By virtue of differential nature at the input stage this flip flop is very robust for bad input slew of data-input and can safely be used where chances of degradation of ER (that is the edge rate or rate of change of voltage) of data path is very high. A regular flop can fail if input data-slew is very high. The setup and hold time of this flip flop are also less than a conventional retention flop FIG. 6 shows a further example of a flip flop according to an embodiment of the present invention. This flip flop is very like the retention flip flop of FIGS. 4 and 5 but has additional data input transistors 90 for inputting a data value directly into the output latching stage 20. These transistors can be used in a low power sleep mode when the input stage 10 is powered down to input the data value directly into the output stage 20.

In low power mode, the transistors 70 are switched on and if no data is being input at the additional data input transistors 90 the dual data lines are held at a logical one and whatever data value the output stage 20 previously held will continue to be held. However, if a data value is applied at the gates of transistors 90, then this data value will be input to the output latching element 20.

If, however, a data value of for example a logical zero is received at the additional data input D (and therefore a logical one at data input D̄) this will cause X̄ to be zero and X to be one. This will cause NMOS transistor 40 to switch on and PMOS transistor 50 to switch off and a logical one will be applied to feedback loop 60 and will be stored therein. The reverse will occur if a logical one is received at the inputs. Thus, a one will be stored and a zero output via inverter 62. It will be understood that if the data inputs are reversed then the data values input at these additional inputs will be stored in the feedback loop and the inverter on the output will not be required.

Figure 7:
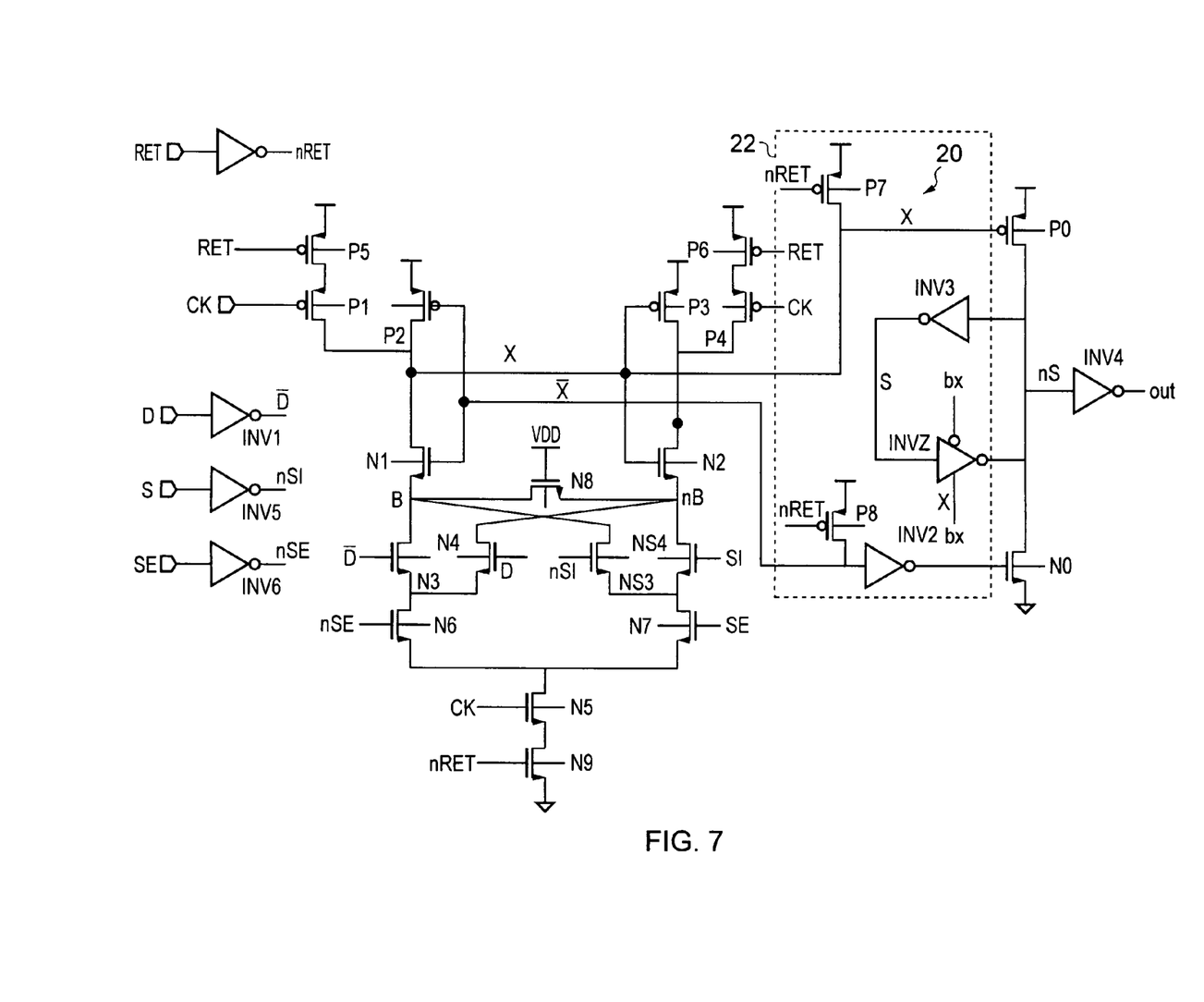
FIG. 7 shows a flip flop with both a retention and can mode of operation according to an embodiment of the present invention.

FIG. 7 shows the topology of a High Performance Low Power Scan Enable Sense Amplifier Retention Flop Architecture. This is an edge triggered retention flop which has "differential" topology at the input stage and allows operation in both normal latching mode and in scan mode, wherein diagnostic data that is to be scanned through the device is input through a separate scan input SI, this input is selected in preference to the data input D, when the scan enable signal SE indicates that the device is to operate in scan mode.

The operation of this device is as follows. In normal operation when RET=0, CK=0: X and X̄ will move into the pre-charge state. During this pre-charge state, X and bX will be at logical one and logical zero respectively; therefore both N0 and P0 transistors will be in cut-off mode; and the previous data in output latch will be retained.

On the rising edge of clock (CK), with RET=0, and D=1 and while not in scan mode, so SE=0: Node X̄ will start discharging through transistors N2/N4. As node X̄ discharges to zero, transistor P2 will switch on and node X will remain at logical one and therefore it will force node X̄ to a logical zero; as a result of this X bX will move to a logical one and this will switch PMOS P0 off and switch NMOS N0 on. As N0 starts conducting, node "S" will discharge to zero and the data will get written into the output latch 20 and therefore a logical one is output at output port "OUT".

On the rising edge of clock (CK), with RET=0, in scan mode so SE=1 and with a scan input of 0 SI=0: Node X will start discharging through transistors N1 and NS3 to attain the zero input. As node X discharges to zero, transistor P3 will start to conduct, and node X̄ will be maintained in a logical one state; and hence bX will remain at logical zero; therefore NMOS N0 will be in cut-off mode. As node "X" falls to logical zero, PMOS P0 will switch on. Therefore node "S" will charge to a logical one and this data value will get stored in latch 10 and logical zero appears at ns and a logical zero is output at the output port "OUT".

On the rising edge of clock (CK), RET=0, in scan mode so SE=1 and with a scan input of 1, so SI=1: Node X̄ will start discharging through transistors N2/NS4. As node X̄ discharges to zero, transistor P2 will get switched on and node X will remain at logical one and therefore it will force node X̄ to logical zero; as a result of this X bX will move to logical one and this will switch off PMOS P0 and switch on NMOS N0. As N0 starts conducting, node "S" will discharge to zero and the data will get written into the output latch therefore we get logical one at ns and a logical zero at output port "OUT".

On the rising edge of clock (CK), RET=0, not in scan mode so SE=0 and with input data of D=0: Node X will start discharging through transistors N1/N3. As node X discharges to zero, transistor P3 will start to conduct, and node X̄ will be maintained in a logical one state; and hence bX will remain in a logical zero state; therefore NMOS N0 will be in cut-off mode. As node "X" falls to logic zero state, PMOS P0 will switch on. Therefore node "S" will charge to logical one and this data value will get stored in latch 20 and a logical zero appears at node nS and a logical one at the output port "OUT".

In retention mode when RET=1, the part of the figure within dotted line 22 will be driven by VDDG and will remain active during this retention mode. Node "X" will be charged to VDDG through power-on device P7 and node "bX" will discharge to zero through power-on device N7 and inverter INV2. Both transistor P0 and N0 will be in cutoff mode and the data at the output stage 20 will be retained. Once the circuit is powered up, the stored data will be appeared at the output "our".

FIG. 7 shows an embodiment of how the retention latching device of FIG. 5 can be amended to operate in scan mode. An alternative way of amending the flip flop of FIG. 5 to provide it with a scan mode capability would be to place a mutilplexer on the data input of the device of FIG. 5 and to use a scan enable signal as the select signal for such a multiplexer such that either the data input D or the scan input SI is input to the input latch 10. This architecture would be fast and low power, however, this architecture cannot be used for a process which dosen't allow input-diffusion, i.e. where the input is directly connected to the diffusion of the tranistor rather than to the gate. The device of FIG. 7 requires a few more additional devices and would be a little slower however, the architecture is robust for all kinds of processes.

In summary the "differential" nature of the input stages of the above described flip flops makes them very robust to bad input slew data. Furthermore, they are compact and can be implemented as a standard cell. It can be used safely where chances of degradation slew of data-input are high and can provide an output that resolves correctly. The conventional flop can fail if input data-slew is very bad as in higher load, the conventional flop also inherently has a higher setup time.

In tests the flip flop according to embodiments of the present invention at 32 nm for a given critical setup time worked fine for input slew of 2.52 ns where conventional DFF failed with input slew of 2.22 ns. (The experiment was done at SS process corer, low voltage 0.9 Volt and high temperature 125° C.).

A further advantage is that this architecture of flops can be used as level-shifter-flops. The area overhead for such a level-shifter-flop is negligible (in comparison to area of level-shifter cell) as it provides the differential input stage by virtue of its inherent differential architecture.

Figure 8:
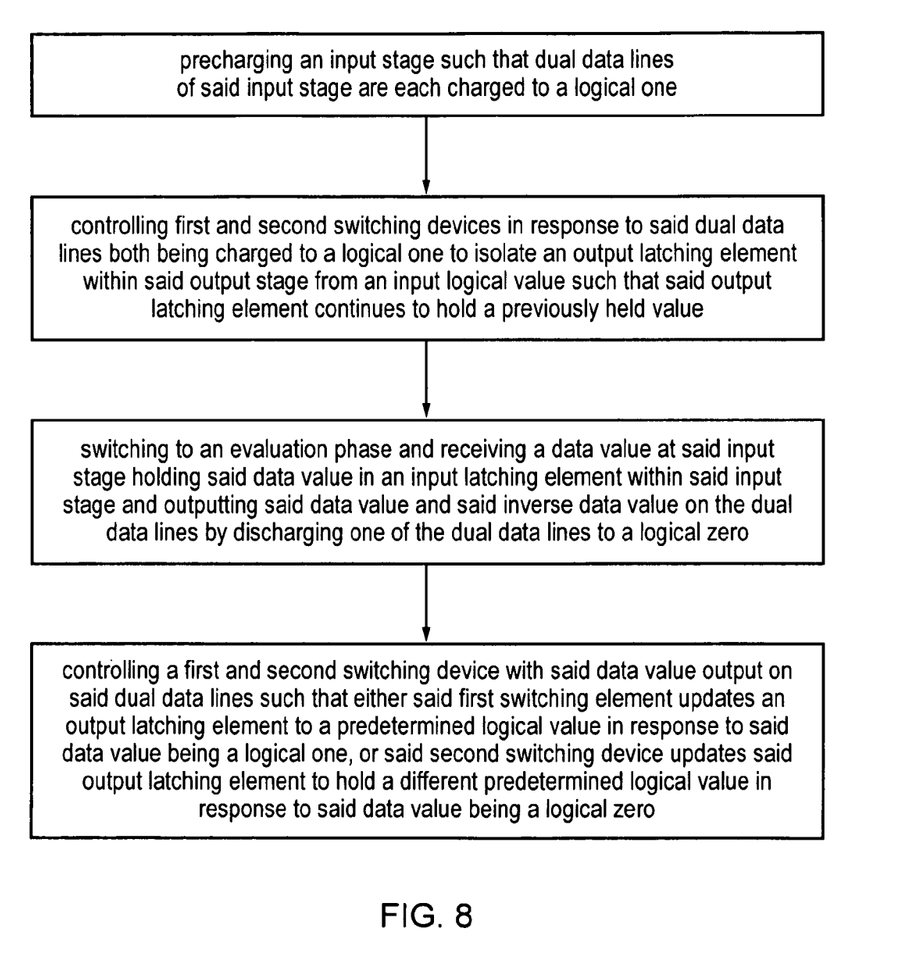
FIG. 8 shows a flow diagram illustrating steps in a method according to an embodiment of the present invention.

FIG. 8 shows a flow diagram illustrating very schematically steps in a method according to an embodiment of the present invention. In an initial step an input stage is precharged in that the dual data lines within the input stage are charged to a logical one. First and second switching devices isolate an output latching element from an input value in response to the dual data lines being charged to a logical one such that it continues to hold the current data value. In response to switching to an evaluation phase a data value is received at the input stage and held within the latching element. It is then output from this stage by discharging one of the two dual data lines. The data value controls two switching devices using the dual data lines such that one of them connects a predetermined value to an output latching element, which then stores this value.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent could be made with the features of the independent claims without departing from the scope of the present invention.

We claim:

1. A data storage circuit for receiving and holding a data value, said data storage circuit comprising:
    an input stage configured to be precharged during a precharge phase, to receive a data value in response to said precharge phase changing to an evaluation phase and to hold said data value during said evaluation phase, said input stage comprises an input latching element for holding said data value and dual data lines for outputting said data value and an inverse version of said data value to an output stage, said input latching element being configured to output a logical one on both of said dual data lines during said precharge phase and to output said data value during said evaluation phase by discharging one of said dual data lines to a logical zero;
    said output stage for holding a value dependent on said data value received from said dual data lines; wherein
    said output stage comprises an output latching element for holding said value, two switching devices for updating said output latching element and an output, said two switching devices each being controlled by respective signals from said dual data lines, such that:
    in response to said data value held in said input stage being a logical one, a first switching device of said two switching devices updates said output latching element with a value indicative of said logical one;
    in response to said data value held in said input stage being a logical zero, a second switching device of said two switching devices updates said output latching element with a value indicative of said logical zero;
    in response to said dual data lines both outputting a logical one, said two switching devices do not supply a logical value to said output latching element such that said output latching element continues to hold a previously held value; and
    said output latching element comprises an inverter and a tristate inverter arranged to form a feedback loop, said tristate inverter being controlled by a signal received from one of said dual data lines and an inverted signal received from an other of said dual data lines, such that during said precharge stage when said dual data lines output logical ones said tristate inverter is driving and said output latching element holds a previously held value, and in response to one of said dual data lines falling to a logical zero indicating a data value, a portion of said tristate converter is turned off and said output latching element is updated to store said value dependent on said data value.

2. A data storage circuit according to claim 1, wherein said input stage comprises a timing signal input for receiving a timing signal, said input stage being responsive to said timing signal having a first logical value to be in said precharge phase and to said timing signal switching to a second logical value to receive said data value and to enter said evaluation phase.

3. A data storage circuit according to claim 2, wherein said timing signal comprises a clock signal.

4. A data storage circuit according to claim 1, wherein
    said data value output from said input stage is routed to control one of said two switching devices and said inverted data value output from said input stage is routed via an inverter to control another of said two switching devices, said one of said two switching devices comprising a PMOS transistor and said other of said two switching devices comprising a NMOS transistor.

5. A data storage circuit according to claim 4, wherein
    said second switching device comprises said PMOS transistor and said output stage comprises an inverter, such that in response to said data value held in said input stage being a logical zero, said second switching device is turned on and updates said output latching element to a logical one and a logical zero is output at said output via said inverter; and
    said first switching device comprises said NMOS transistor, in response to said data value held in said input stage being a logical one, said first switching device is turned on and updates said output latching element such that logical zero is stored and a logical one is output at said output via said inverter.

6. A data storage circuit according to claim 2, wherein said input stage further comprises:
    at least one precharge control switching device responsive to said timing signal indicating said precharge phase to charge said dual data lines to a logical one;

data value inputs for receiving said data value and said inverse data value;
a data input control switching device responsive to said timing signal indicating said evaluation phase to update said input latching element with said data value received at said data value inputs.

7. A data storage circuit for receiving and holding a data value, said data storage circuit comprising:
an input stage configured to be precharged during a precharge phase, to receive a data value in response to said precharge phase changing to an evaluation phase and to hold said data value during said evaluation phase, said input stage comprises an input latching element for holding said data value and dual data lines for outputting said data value and an inverse version of said data value to an output stage, said input latching element being configured to output a logical one on both of said dual data lines during said precharge phase and to output said data value during said evaluation phase by discharging one of said dual data lines to a logical zero;
said output stage for holding a value dependent on said data value received from said dual data lines; wherein
said output stage comprises an output latching element for holding said value, two switching devices for updating said output latching element and an output, said two switching devices each being controlled by respective signals from said dual data lines, such that:
in response to said data value held in said input stage being a logical one, a first switching device of said two switching devices updates said output latching element with a value indicative of said logical one;
in response to said data value held in said input stage being a logical zero, a second switching device of said two switching devices updates said output latching element with a value indicative of said logical zero;
in response to said dual data lines both outputting a logical one, said two switching devices do not supply a logical value to said output latching element such that said output latching element continues to hold a previously held value, wherein said input stage further comprises:
diagnostic data inputs for receiving a diagnostic data value and an inverse diagnostic data value;
data value inputs for receiving said data value and said inverse data value;
switching circuitry responsive to a value of a diagnostic mode enable signal and to said timing signal indicating said evaluation phase to update said input latching element either with said data value received at said data value inputs or with a diagnostic data value received at said diagnostic data inputs.

8. A data storage circuit for receiving and holding a data value, said data storage circuit comprising:
an input stage configured to be precharged during a precharge phase, to receive a data value in response to said precharge phase changing to an evaluation phase and to hold said data value during said evaluation phase, said input stage comprises an input latching element for holding said data value and dual data lines for outputting said data value and an inverse version of said data value to an output stage, said input latching element being configured to output a logical one on both of said dual data lines during said precharge phase and to output said data value during said evaluation phase by discharging one of said dual data lines to a logical zero;
said output stage for holding a value dependent on said data value received from said dual data lines; wherein
said output stage comprises an output latching element for holding said value, two switching devices for updating said output latching element and an output, said two switching devices each being controlled b respective signals from said dual data lines, such that:
in response to said data value held in said input stage being a logical one, a first switching device of said two switching devices updates said output latching element with a value indicative of said logical one;
in response to said data value held in said input stage being a logical zero, a second switching device of said two switching devices updates said output latching element with a value indicative of said logical zero;
in response to said dual data lines both outputting a logical one, said two switching devices do not supply a logical value to said output latching element such that said output latching element continues to hold a previously held value, said data storage circuit being arranged such that in response to a sleep signal indicating entry to a low power mode:
a voltage difference across at least a portion of said circuit is reduced such that said portion of said circuit is powered down;
a voltage difference across said output stage is maintained; wherein
said data storage device further comprises at least one sleep mode switching device responsive to said sleep signal to charge said dual data lines to a logical one, such that during said sleep mode, said two switching devices do not supply a logical value to said output latching element such that said output latching element continues to hold and output a previously held data value.

9. A data storage circuit according to claim 8, further comprising at least one power switching device for isolating said input stage from a power supply such that said input stage is powered down in response to said sleep signal.

10. A data storage circuit according to claim 8, further comprising a further two switching devices arranged between said sleep mode switching device and respective ones of said dual data lines, said further two switching devices receiving said data value and an inverse version of said data value as control signals, said further two switching devices being configured such that in response to said sleep signal indicating entry to low power mode and said control signal being a logical zero a logical one is output on said corresponding dual data line and in response to said control signal being a logical one a logical zero is output on said corresponding dual data line.

11. A data storage device according to claim 9, wherein said sleep mode switching device comprises two pmos transistors for coupling a high voltage rail to respective ones of said dual data lines in response to a logical zero as a control signal via two further pmos transistors, said two further pmos transistors receiving said data value and an inverse version of said data value as control signals.

12. A method of receiving and holding a data value within a data storage circuit comprising an input stage and an output stage comprising the steps of:
during a precharge phase:
precharging said input stage such that dual data lines of said input stage are each charged to a logical one;
controlling first and second switching devices in response to said dual data lines both being charged to a logical one to isolate an output latching element within said output stage from an input logical value such that said output latching element continues to hold a previously held value;

switching to an evaluation phase and receiving a data value at said input stage;

during said evaluation phase:

holding said data value in an input latching element within said input stage and outputting said data value and said inverse data value on said dual data lines by discharging one of said dual data lines to a logical zero;

controlling a first and second switching device with said data value output on said dual data lines such that either said first switching element updates an output latching element to a predetermined logical value in response to said data value being a logical one, or said second switching device updates said output latching element to hold a different predetermined logical value in response to said data value being a logical zero, wherein said output latching element comprises an inverter and a tristate inverter arranged to form a feedback loop, said method comprising the further steps of:

during said precharge phase controlling said tristate inverter with a signal received from one of said dual data lines and an inverted signal received from an other of said dual data lines to drive such that said output latching element holds a previously held data value; and during said evaluation phase, in response to one of said dual data lines falling to a logical zero indicating a data value, turning a portion of said tristate converter off and storing said value indicative of said data value in said output latching element.

13. A method according to claim 12, said method comprising receiving a timing signal at said input stage, said input stage being in said precharge phase in response to said timing signal having a first logical value and being in said evaluation phase in response to said timing signal having a second logical value.

14. A method according to claim 13, wherein said timing signal comprises a clock signal.

15. A method of receiving and holding a data value within a data storage circuit comprising an input stage and an output stage comprising the steps of:

during a precharge phase:

precharging said input stage such that dual data lines of said input stage are each charged to a logical one;

controlling first and second switching devices in response to said dual data lines both being charged to a logical one to isolate an output latching element within said output stage from an input logical value such that said output latching element continues to hold a previously held value;

switching to an evaluation phase and receiving a data value at said input stage;

during said evaluation phase:

holding said data value in an input latching element within said input stage and outputting said data value and said inverse data value on said dual data lines by discharging one of said dual data lines to a logical zero;

controlling a first and second switching device with said data value output on said dual data such that either said first switching element updates an output latching element to a predetermined to logical value in response to said data value being a logical one, or said second switching device updates said output latching element to hold a different predetermined logical value in response to said data value being a logical zero, said method comprising the following further steps performed in response to a sleep signal indicating entry to a low power mode:

reducing a voltage difference across at least a portion of said circuit such that said portion of said circuit is powered down;

maintaining a voltage difference across said output stage; wherein charging said dual data lines to a logical one;

controlling first and second switching devices in response to said dual data lines both being charged to a logical one to isolate an output latching element within said output stage from an input logical value such that said output latching element continues to hold a previously held value.

16. A method of receiving and holding a data value within a data storage circuit comprising input stage and an output stage comprising the steps of:

during a precharge phase:

precharging said input stage such that dual data lines of said input stage are each charged to a logical one;

controlling first and second switching devices in response to said dual data lines both being charged to a logical one to isolate an output latching element within said output stage from an input logical value such that said output latching element continues to hold a previously held value;

switching to an evaluation phase and receiving a data value at said input stage;

during said evaluation phase:

holding said data value in an input latching element within said input stage and outputting said data value and said inverse data value on said dual data lines by discharging one of said dual data lines to a logical zero;

controlling a first and second switching device with said data value output on said dual data lines such that either said first switching element updates an output latching element to a predetermined logical value in response to said data value being a logical one, or said second switching device updates said output latching element to hold a different predetermined logical value in response to said data value being a logical zero, further comprising the following steps performed in response to a sleep signal indicating entry to a low power mode:

reducing a voltage difference across at least a portion of said circuit such that said portion of said circuit is powered down;

maintaining a voltage difference across said output stage; wherein applying a data value and an inverse version of said data value to respective ones of said dual data lines via two switching devices;

controlling a first and second switching device with said data value output on said dual data lines such that either said first switching element updates an output latching element to a predetermined logical value in response to said data value being a logical one, or said second switching device updates said output latching element to hold a different predetermined logical value in response to said data value being a logical zero;

in response to said data value and said inverse version of said data value no longer being applied to said two switching devices applying a logical one to said dual data lines; and controlling first and second switching devices in response to said dual data lines both being charged to a logical one to isolate an output latching element within said output stage from an input logical value such that said output latching element continues to hold a previously held value.

17. A standard cell representing a functional component to be provided within a placement area of a predetermined size and having predetermined boundary conditions on an integrated circuit, said functional component being the data storage circuit according to claim 1.

18. Data storage means for receiving and holding a data value said data storage circuit comprising:
- an input means for being precharged in a precharged phase and for receiving a data value in response to said precharge phase changing to an evaluation phase and for holding said data value during said evaluation phase, said clocked input means comprising an input latching means for holding said data value and dual data lines for outputting said data value and an inverse version of said data value to an output means, said input latching means being configured to output a logical one on both of said dual data lines during said precharge phase and to output said data value during said evaluation phase by discharging one of said dual data lines to a logical zero;
- said output means for holding a value dependent on said data value received from said dual data lines; wherein
- said output means comprises an output latching means for holding said value, two switching means for updating said output latching element and an output, said two switching means each being controlled by respective signals from said dual data lines, such that:
- in response to said data value held in said input stage being a logical one, a first switching means of said two switching means updates said output latching means with a value indicative of said logical one;
- in response to said data value held in said input stage being a logical zero, a second switching means of said two switching means updates said output latching means with a value indicative of said logical zero; and
- in response to said dual data lines both outputting a logical one, said two switching means do not supply a logical value to said output latching means such that said output latching means continues to hold a previously held value, said output latching means comprises an inverter and a tristate inverter arranged to form a feedback loop, said tristate inverter being controlled by a signal received from one of said dual data lines and an inverted signal received from an other of said dual data lines, such that during said precharge stage when said dual data lines output logical ones said tristate inverter is driving and said output latching means holds a previously held value, and in response to one of said dual data lines falling to a logical zero indicating a data value, a portion of said tristate converter is turned off and said output latching means is updated to store said value dependent on said data value.

* * * * *